(12) United States Patent
Winterton et al.

(10) Patent No.: US 7,105,053 B2
(45) Date of Patent: Sep. 12, 2006

(54) ENERGY EFFICIENT METHOD FOR GROWING POLYCRYSTALLINE SILICON

(75) Inventors: Lyle C. Winterton, Moses Lake, WA (US); John P. Hill, Moses Lake, WA (US)

(73) Assignee: REC Silicon Inc., Moses Lake, WA (US)

( * ) Notice: Subject to any disclaimer, the term of this patent is extended or adjusted under 35 U.S.C. 154(b) by 384 days.

(21) Appl. No.: 10/367,570

(22) Filed: Feb. 13, 2003

(65) Prior Publication Data

US 2003/0150378 A1    Aug. 14, 2003

Related U.S. Application Data

(60) Provisional application No. 60/357,212, filed on Feb. 14, 2002.

(51) Int. Cl.
*C30B 25/12* (2006.01)
*C30B 25/14* (2006.01)

(52) U.S. Cl. .............................. 117/75; 117/84; 117/87; 117/921

(58) Field of Classification Search ................... 117/75, 117/87, 921; 777/84
See application file for complete search history.

(56) References Cited

U.S. PATENT DOCUMENTS

| | | | |
|---|---|---|---|
| 4,464,222 A | 8/1984 | Gutsche |
| 4,491,604 A | 1/1985 | Lesk et al. |
| 5,331,186 A | 7/1994 | Morizuka |
| 5,904,981 A | 5/1999 | Oda |
| RE36,936 E | 10/2000 | Keck et al. |
| 6,365,225 B1 | 4/2002 | Chandra et al. |
| 6,503,563 B1 | 1/2003 | Yatsurugi et al. |

*Primary Examiner*—Felisa Hiteshew
(74) *Attorney, Agent, or Firm*—Klarquist Sparkman, LLP

(57) ABSTRACT

Polysilicon dendrites are grown by depositing silicon on a polysilicon rod or other substrate. Surface temperature is increased to a temperature at which needle-like dendrites develop due to the deposition of silicon from silicon-containing molecules in the surrounding reactor atmosphere. Thereafter, the surface temperature is gradually reduced so that silicon that deposits on the needle-like dendrites causes the dendrites to grow and assume a generally flared shape.

28 Claims, 2 Drawing Sheets

ENERGY EFFICIENT METHOD FOR GROWING POLYCRYSTALLINE SILICON

CROSS REFERENCE TO RELATED APPLICATION

This application claims the benefit of U.S. Provisional Application No. 60/357,212, filed Feb. 14, 2002, incorporated herein by reference in its entirety.

BACKGROUND

Polycrystalline silicon, or polysilicon, is a critical raw material for the electronics industry. It is the starting material for production of single-crystal silicon ingots for the semiconductor industry. These ingots are produced by either the Czochralski (CZ) or the Float Zone (FZ) method. The majority of polysilicon produced is consumed in the CZ process.

In the CZ crystal-pulling process, chunks of polysilicon are loaded into a quartz crucible. The chunks of polysilicon are of random size and shape. The crucible is filled and loaded into the CZ furnace. The polysilicon is melted and a single crystal ingot is withdrawn from the melt.

The yield of single crystal silicon is a function of the quantity of molten silicon that can be included within the crucible as well as the quality of the polysilicon added. In order to maximize the initial polysilicon chunk packing density within the crucible, polysilicon chips, granules or short rod pieces may be added to the quartz crucible. After a crystal is pulled from the melt, the crucible may be recharged with additional polysilicon chunk or chips to allow one or more additional pulls from the same crucible.

Recharging a crucible with polysilicon may be accomplished by feeding silicon chips or granules through a feeding apparatus into the crucible. It is desirable that this recharge feed material be small in weight and size in order that problems due to the disturbance of the melt surface by the falling silicon granules be avoided. The small weight and size also allow the polysilicon to be fed to the crucible though valves, tubes or other openings that are of minimal size thus avoiding heat loss and high equipment cost.

Contaminants added to the melt with the polysilicon can impact the yield of single-crystal silicon ingot by inducing defects and/or causing loss of structure. These contaminants can also cause poor device performance in the integrated circuits manufactured from contaminated silicon wafers. Contaminants are found on the polysilicon surfaces or come from the dissolution of the quartz crucible. The polysilicon surface-contamination typically originates from the breaking process used to form chunks. Excessive impacting to form the desirable small silicon chips or granules may result in higher levels of contaminants on the polysilicon surfaces.

The production of polysilicon rods by the pyrolytic decomposition of a gaseous silicon compound, such as silane or a chlorosilane, on a suitable filament substrate is a well-known process. The process comprises:

a) An even number of electrodes are attached to a base plate, each electrode can have a starting filament (starter rod) attached.
b) The filaments are joined in pairs by a connecting bridge. Each bridge is a piece of starter rod material and is joined to two starting filaments. Each set of two filaments and a bridge thus is an inverted, generally U-shaped member, commonly referred to as a hairpin. For each hairpin assembly, an electrical pathway is formed between a pair of electrodes within the reactor. An electrical potential applied to the electrodes can thus supply current required to heat the attached hairpin resistively.
c) The hairpins are contained in a bell jar enclosure that mates with the base plate to define a batch reactor allowing operation under vacuum or positive pressure conditions.
d) A gaseous silicon precursor compound of the desired semiconductor material and other gases, as necessary, are fed into the reactor.
e) The hairpins are electrically heated to a temperature sufficient to effect decomposition of the gaseous precursor compound and simultaneous deposition of the semiconductor material onto the hairpins, thereby producing generally U-shaped polysilicon rods of substantial diameter. The rods are generally circular in cross-section, except at the corners where the filaments are joined to the connecting bridges.
f) Any by-product gases and unreacted precursor compounds are exhausted from the reactor.

The principles of design of present state of the art reactors for the pyrolysis of silane and chlorosilanes are set forth in, for example, U.S. Pat. Nos. 4,150,168; 4,179,530; 4,724,160; 4,826,668; and 6,365,225.

The temperature of the decomposition process is carefully controlled in order to maintain the rod surface relatively smooth while maintaining reasonable reaction rates and conversion of silicon precursor compounds to silicon. The surface temperature controls the roughness of the deposited layer of polysilicon as well as the reaction kinetics. Lower surface temperatures result in smoother rods because the deposition is uniform over the rod surface. However, lower temperatures slow the reaction kinetics resulting in a reduced deposition rate, as do lower concentrations of silicon in the reactor environment.

Higher surface temperatures increase deposition rate, but they also initiate selective deposition onto surface mounds. Under normal conditions, rod temperature is raised until the rod surface is covered with small mounds whose edges are fused with neighboring mounds and free of void spaces. This condition represents the fastest deposition rate (fastest reaction kinetic rate) while maintaining a rod surface free of void spaces. Such mounds are integrally attached to the rod and have an aspect ratio, as defined below, that is less than one (<1), typically 0.5 or less.

As chemical vapor deposition proceeds, the diameter of the silicon rod increases. Power is increased to maintain the silicon rod at an appropriate surface temperature. The total energy consumed to produce a unit mass of polysilicon depends upon the rod surface temperature, final rod diameter (power applied) and the rate at which silicon precursor gas decomposes to form silicon. If rods can reach the target diameter faster (due to higher reaction kinetics and higher deposition rates), the energy required to maintain the rods at temperature is reduced, decreasing the overall energy requirement to produce a unit mass of polysilicon.

The processing of polysilicon rods into chunks or chips is either a mechanical or a thermo-mechanical process. For Czochralski crystal growth, silicon rods are broken into chunks or chips using mechanical devices such as crushers, mills or hammers. In addition, thermally stressing rods aids in the breaking process. Typically, rods are broken into irregularly shaped chunks up to about 100 mm in size.

Mechanical breaking devices add contamination to the polysilicon pieces due to physical impacting. In order to produce the desirable smaller chips (10 to 30 mm), additional impacting is required, which impacting leads to higher levels of silicon surface contamination. This surface contamination, if great enough, must be removed by cleaning or acid etching or it can impact the yield of the single crystal silicon ingot. These cleaning and etching systems add cost to the polysilicon manufacturing process.

SUMMARY OF THE DISCLOSURE

This disclosure relates to a method for producing small polysilicon dendrites that are useful as silicon particles for charging the crucible of a crystal pulling furnace and for other purposes. These dendrites, some of which may be roughly teardrop-shaped, are produced by growing rather than by mechanically breaking. The formation of dendrites greatly reduces the electrical energy utilization as compared to growing large diameter polysilicon rods.

During the pyrolytic decomposition of silicon-containing precursor gas to form silicon via chemical vapor deposition, conditions are maintained in a reactor such that silicon deposition becomes extraordinarily selective. Silicon initially deposits on a substrate in the form of needle-like dendrites. Then, by gradually lowering the surface temperature, the needle-like dendrites grow outward and form larger individual dendrites that are widely separated from one another. The major dendrite diameter is controlled by the temperature profile used. The dendrite length is controlled by the mass of silicon deposited.

Dendrites can be removed from a polysilicon rod by any of several methods. By growing dendrites that have a narrow stem portion that connects the bulk dendrite to the substrate, the dendrites are easily broken away. With the dendrite stems appropriately sized, the force required to remove dendrites from the substrate is much lower than that required for producing chips from a typical polysilicon rod that is not encrusted with dendrites. The result is a reduction in contamination imparted to the polysilicon surface.

The energy required to produce dendrite polysilicon is substantially less than that required to produce conventional polysilicon. The power input to the reactor increases as the temperature is raised. However, the reaction rate controlling the deposition of silicon also increases, and therefore lowers the energy requirements to produce a unit mass of polysilicon. The kinetic effect is larger than the temperature effect resulting in an overall decrease in energy required to produce a unit mass of polysilicon. The energy reduction can approach or exceed 20 to 25%.

DETAILED DESCRIPTION

Figure 1:
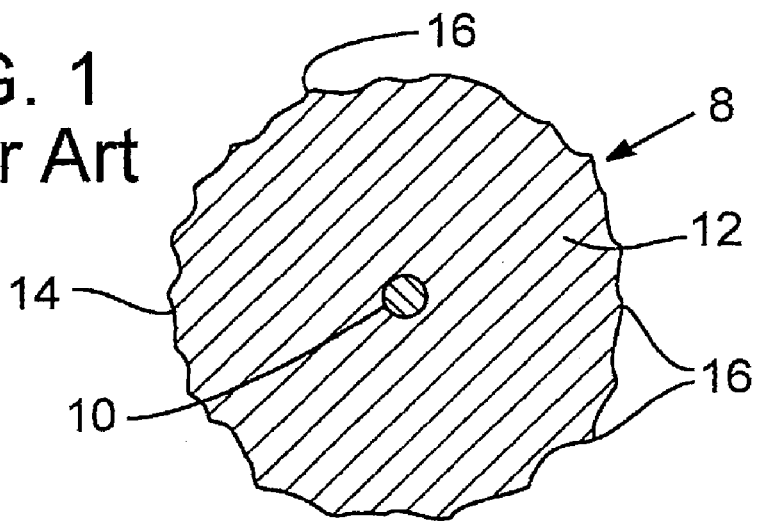
FIG. 1 is a cross-sectional view of a conventionally-grown polysilicon rod. The rod surface is relatively smooth and there is no surface dendritic growth.

Rods grown under traditional conditions in a thermal decomposition furnace are similar to a rod 8 shown in FIG. 1 wherein a starter filament or rod 10, is covered by a continuous, generally cylindrical growth layer 12 of polycrystalline silicon. The growth layer 12 has a generally smooth exposed outer surface 14 with some rounded mounds 16.

To obtain such generally smooth-surfaced rods using silane ($SiH_4$) as the reactant gas, rod surface temperatures must be maintained on the order of 825° C. Corresponding temperatures using trichlorosilane ($SiHCl_3$) as reactant are on the order of 1050° C. to 1100° C. Other silicon-containing compounds, such as disilane ($Si_2H_6$), trisilane ($Si_3H_8$), dichlorosilane ($SiH_2Cl_2$), silicon tetrachloride ($SiCl_4$), dibromosilane ($SiH_2Br_2$), tribromosilane ($SiHBr_3$), silicon tetrabromide ($SiBr_4$), diiodosilane ($SiH_2I_2$), triiodosilane ($SiHI_3$), and silicon tetraiodide ($SiI_4$), each have its own optimum surface temperature for deposition. The silicon-containing gas supplied to thermal decomposition furnace typically will contain one or more of these silicon-containing compounds plus carrier or diluent gasses as appropriate.

Because of the difficulty in measuring the elevated temperature of silicon rod surfaces, the temperatures reported in this disclosure are "black-body" temperatures. They do not take into account the emissivity of the rod surface nor the apparent-emissivity resulting from varying levels of a gray-body enclosure. Consequently, actual temperatures may vary substantially with changes in reactor geometry and with the surface roughness of the polysilicon rod.

Temperature and other conditions inside a thermal decomposition furnace can be controlled to induce the growth of polysilicon dendrites on a substrate in the furnace. In particular, silicon dendrites can be grown in a reactor configured for depositing polysilicon onto electrically heated U-shaped members. This best is accomplished by appropriately regulating the surface temperature of the U-shaped members.

Figure 2:
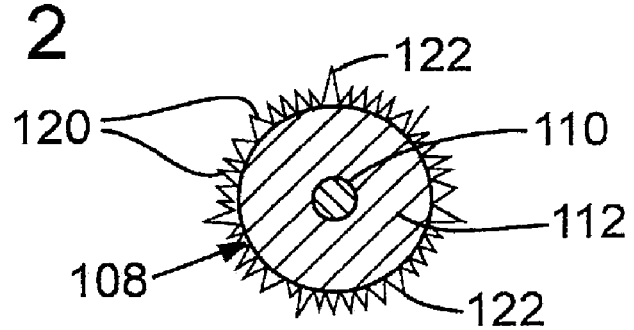
FIG. 2 is a schematic cross-sectional view of a rod grown under conditions that produce dendrites on the rod surface. The rod has grown only a few millimeters under dendrite growth conditions.
Figure 3:
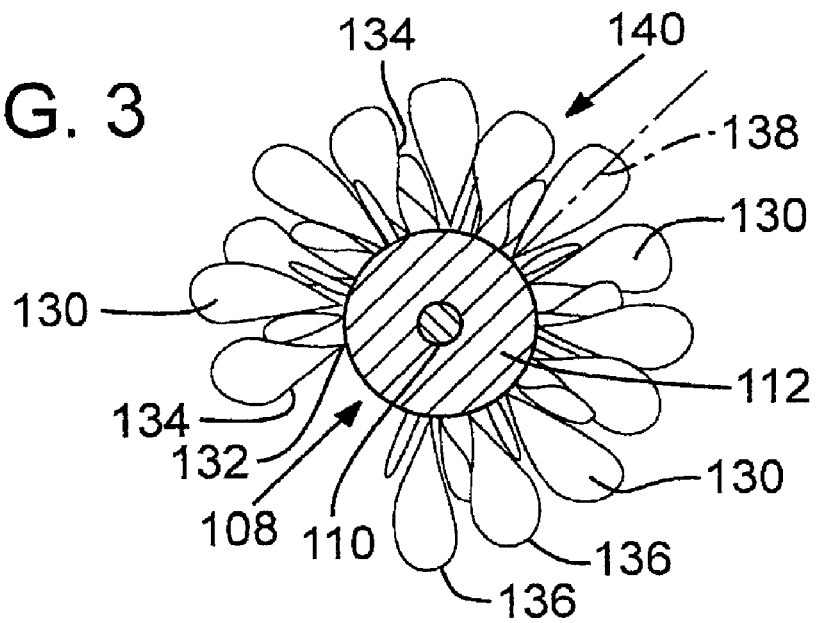
FIG. 3 is a schematic cross-sectional view of a rod encrusted with fully-grown dendrites.

FIGS. 2 and 3 illustrate the formation of dendrites 130 on a core rod 108 in such a furnace. Prior to initiating dendrite growth, one may grow a small diameter core rod 108 in a reactor to act as a skeletal structure for the later growth of the dendrites. Such a core rod 108 is a desirable substrate because of its strength and because it eventually can be processed into silicon chunks. The illustrated core rod 108 includes a filament or starter rod 110 covered by a relatively thin growth layer 112. The core rod 108 is formed by supplying a silicon-containing gas to the interior of the furnace and maintaining the temperature in a range that causes the gas to decompose and deposit silicon on the filament 110. To allow sufficient room for dendrite growth, the core rod 108 is smaller in diameter than a rod grown in a typical process. A core rod 108 having a 40–45 mm diameter is a convenient size. Larger and smaller rod diameters will work so long as the core rod 108 is sufficiently strong and so long as the core rod 108 is not so large that there is no room for dendrite growth and gas flow between the core rod 108 and a surface of the reactor or an adjacent core rod.

Although it is helpful to start with a core rod of the type shown in FIGS. 2 and 3, such a core rod is not a necessary requirement for growth of the dendrites. Dendrites can be grown on the surfaces of other substrates so long as the surface temperature is appropriate. Thus, dendrites could be grown on other types of substrates, such as directly on silicon filaments. Advantageously, dendrites could be grown on high surface area substrates such as the tubular substrates described in U.S. Pat. No. 6,365,225. Appropriate tubular substrates can be generally cylindrical with a cross-section that is generally circular, or of some other cross-section such as hexagonal or octagonal. Substrates of still other shapes could be used so long as sufficient room is provided for dendrites to grow thereon. To avoid contamination issues, it is best for the substrate to be made of or coated with silicon. The substrate could be made of almost any material that would remain solid at reaction temperatures. Preferred non-silicon substrate materials are graphite, quartz, and high melting point metals, particularly molybdenum, tantalum, and tungsten.

Dendrite growth is best initiated by pyrolytically decomposing a silicon-containing precursor gas to form silicon via chemical vapor deposition on the surface of a substrate that is at a temperature level well above normal levels that form void-free silicon mounds. Under these extreme temperature conditions, silicon deposition is extraordinarily selective onto individual dendrites that are widely separated from one another. The initial deposition is in the form of needle-like dendrites.

In a particular non-limiting example, a gas that contains silane is fed into a reactor. The silane decomposes inside the reactor and deposits on a heated filament 110 to grow a core rod 108. The surface temperature of the core rod 108 is suddenly raised to a temperature that is in a range such that the temperature is at least 875° C. and is below the melting point of silicon, with best results achieved if the core rod surface temperature is raised to at least 975° C. Immediately, the silane decomposition and subsequent chemical-vapor-deposition becomes selective and small needle-like dendrites 120 begin to form. The result is a rod encrusted with needle-like dendrites 120 as shown in FIG. 2. The needle-like dendrites 120 taper outwardly from the core rod 108 to points 122 at their distal ends as also shown in FIG. 2. Such needle-like dendrites will be incorporated into the stems of larger dendrites to be grown on the core rod 108. Raising or lowering the dendrite-initiation temperature controls the needle-like dendrite cross-sectional area and thus affects the configuration of the larger dendrites to be grown thereon. Higher temperatures form smaller dendrites and lower temperatures form larger or wider dendrites.

Reactor conditions other than high temperature can encourage the formation of needle-like dendrites. These structures tend to form when the reactor atmosphere has a concentration of silicon-containing molecules that is lower than the concentration of such molecules in the reactor atmosphere used for growing silicon rods. In particular, when silicon is to be deposited by the decomposition of silane, the formation of needle-like dendrites is encouraged by a low silane concentration of 0.1 to 0.25 vol % in the reactor atmosphere. Needle-like dendrites also have a tendency to form on mechanically roughened substrate surfaces and on substrate surfaces that have been seeded with catalytically active elements such as chromium, copper, iron, molybdenum, and nickel or compounds such as silicates and metal oxides.

Under these other methods of forming needle-like dendrites, the selective growth of the needles must be sustained long enough for individual dendrites of substantial size to form. Otherwise, during further chemical vapor deposition, silicon may cover and smooth-over the needle-like structures and not produce distinct, harvestable dendrites. Typically, neither silicon deprivation nor a surface treatment alone is sufficient to induce the growth desired needle-like dendrites. Most often, these other methods must be used in combination, or the surface temperature also must be elevated during at least a portion of the time when the needle-like dendrites are growing.

Use of a low concentration of silicon in the reactor atmosphere is not the favored technique because the silicon deposition rate is thereby greatly reduced. Catalytically active materials are contaminants that typically must be removed when dendrites are harvested. Mechanically roughened surfaces will not sustain needle-like dendrite growth beyond the first formation of needles that cover the original roughened surface. For these reasons, the use of high temperatures during the forming of the needle-like dendrites is favored.

Next, by further silicon deposition onto at least some of the needle-like dendrites 120, it is possible to grow multiple dendrites that are larger than the needle-like dendrites on which they are grown. FIG. 3 illustrates a rod encrusted with such larger dendrites 130. The larger dendrites 130 are distributed over substantially the entire surface of a core rod 108 and are separate from one another. Although of no set size, the larger dendrites typically extend radially from the core rod by more than 3 mm, and preferably extend from the core rod as far as possible because longer dendrites are easier to break off and thus are easier to harvest than shorter dendrites. The larger, harvestable dendrites have an aspect ratio equal to or greater than one (≧1), where the ratio is calculated by dividing "length" (the distance a dendrite extends generally perpendicularly to the surface of the substrate) by "width" (the largest diameter of the dendrite measured parallel to the surface of the substrate). Because substrates typically do not have a perfectly flat surface, the aspect ratio is measured in reference to an imaginary plane that touches the substrate at the location where the dendrite is attached and that extends generally in parallel to that region of the substrate surface which immediately surrounds the location where the dendrite is attached. Thus, for example, when the substrate is a core rod having a generally cylindrical surface of the type illustrated, the imaginary plane is generally tangential to the surface of the core rod in the region which immediately surrounds the location where the dendrite is attached, and the imaginary plane is generally perpendicular to a straight line that extends radially from the center of the filament and along the centerline of the dendrite. Dendrites having an aspect ratio ≧1 have a recognizable centerline 138 that extends roughly perpendicularly to the substrate surface, so the length simply can be measured parallel to the centerline and the width can be measured perpendicular to the centerline.

The illustrated fully formed dendrites 130 have surfaces 134 that flare outwardly from the core rod 108 to bulbous, generally hemispherical end portions 136. Such flared dendrites 130 are developed by, after the initial growth of needle-like dendrites, progressively lowering the surface temperature of the dendrite-encrusted rod while continuing to deposit silicon. As the surface temperature is lowered, the chemical-vapor-deposition becomes less selective allowing the needle-like dendrites 120 to widen and fuse with adjacent needles. Continuing deposition of silicon on groups of fused needles, under proper conditions, causes the growth of relatively large dendrites that often assume the teardrop-like shape illustrated in FIG. 3. If silicon deposition were allowed to continue for a sufficient time, the dendrites would grow to the extent that they touch each other and eventually fuse together.

The major dendrite diameter is best controlled by choice of a suitable temperature reduction profile for silicon deposition after the needle-growing stage. Dendrite length is controlled by the mass of silicon deposited. The choice of an appropriate decreasing temperature profile and the amount of silicon deposited depend on the product dimensions desired, the reactor atmosphere used, the reactor power supply, the reactor configuration, and silicon-containing reactant gas.

As a non-limiting example, with silane as the reactant, teardrop-shaped dendrites that are nominally 20 mm in length and separate are formed on needle-like dendrites by controlling the surface temperature and silane feed rate. In particular, the surface temperature is lowered gradually from the raised surface temperature of at least 875° C. down to a temperature of about 850° C. while the silane is supplied to the dendrites at a relatively low concentration in the reactor atmosphere. Increasing the percentage silicon content of the reactor atmosphere can facilitate the fattening out of dendrites to produce large dendrites having the generally teardrop shape shown in FIG. 3.

The dendrites tend to grow wider as a factor of distance from the substrate because gas that is fed into the reactor first encounters the outermost part of a dendrite and tends to deposit silicon at that location. A relatively small amount of the gas that is fed into the reactor makes its way into the interstices that are between the dendrites and near the substrate; and the gas which passes near the substrate is typically somewhat depleted of silicon, so greater amounts of silicon deposit near the outer regions of the dendrites than on the regions of the dendrites that are nearer to the substrate.

Depending on the shape of the temperature reduction curve used, the large dendrites could be more rod-like in shape or could have outer end portions that are even more bulbous than the illustrated dendrites 130. If the temperature is reduced relatively slowly, the shape of the final dendrites will be more needle-like. If the temperature is dropped rapidly, the final dendrites will be more flared or bulbous. And dendrite shape can vary from one dendrite to another on any given dendrite-encrusted substrate.

Temperature reduction profiles for dendrite formation using silicon-containing precursor gasses other than silane would be similar to those used for the deposition of silicon from silane. But the curves would be shifted in temperature as appropriate for the reactor atmosphere being used. For example, the temperature offset between silane and trichlorosilane to form smooth rod growth is about 250° C. Offset temperatures for any silicon-containing precursor reactant also may be chosen based on the desired rate of reaction and the selectivity of the reactant to form dendrites. Thus, one skilled in the art could modify the silicon precursor source gas stoichiometry and surface temperature as well as other reactor conditions to produce dendrite polysilicon.

Dendrite formation as described herein most often occurs at temperatures greater than those typically used for conventional polysilicon growth. These elevated temperatures alone would increase the energy requirements to produce a unit mass of polysilicon. However, elevated temperatures have the additional effect of increasing the reaction kinetics and thus increasing the silicon deposition rate. For the silane-to-silicon process, when sufficient reactant is provided, the increases in achieved reaction rates exceed the excess energy consumption caused by the elevated rod temperature. The result is a considerable decrease in the overall energy requirement to produce a unit mass of polysilicon.

Actual energy reduction per unit mass of polysilicon depends on a variety of parameters such as reactor design, numbers of substrate members, silicon-containing precursor gas used, reactant residence time, and reactant feed rate. For example, using silane as source gas, energy reductions on the order of 20 to 25% or more, per unit mass of polysilicon, can be achieved. Energy savings will also vary depending upon the relative increase in reaction kinetics (due to increasing rod temperature). Changes in silicon-containing reactants, reactant concentrations and the complex chemical equilibrium (associated with other compounds present in the process) affect the energy savings. Although the amount of energy savings may vary somewhat, it is anticipated that one skilled in the art could apply the ideas presented in this disclosure to reactor atmospheres containing any of a number of silicon-containing reactant compounds to obtain similar results.

Following the growth process, a dendrite-encrusted rod of the type shown at 140 in FIG. 3 can be dissembled to prepare a batch of polycrystalline material to charge a crystal-growing furnace. First, dendrites 130 are removed from the core rod 108. This can be accomplished by using mechanical devices such as crushers, mills, hammers, or the like. However, because the dendrites 130 are held onto the core rod 108 by small-diameter stems 132 that incorporate the original needle-like dendrites 120 of polysilicon, the mechanical force required to remove the dendrites 130 is small relative to that required for breaking standard rods into 10 to 30 mm chips.

To achieve this ease of harvesting, the dendrites can be grown so that they have a stem portion that is no greater than about 8 mm in diameter, at its narrowest point, measured perpendicular to the centerline of the dendrite. For most efficient harvesting, a dendrite should have an aspect ratio greater than 2. The stem cross-sectional area and the corresponding effort required to remove dendrite polysilicon can be controlled by raising or lowering the initiation temperature for producing the needle-like dendrites. Process conditions can be established that allow the dendrite polysilicon to be removed by hand. And by controlling reactor conditions to keep the diameter of the dendrite stems small enough, dendrites will break-off due to their own weight. Such conditions eliminate the need for physically impacting the polysilicon and thereby eliminate the contamination that otherwise would result from impacting.

The polysilicon core rod 108 can be broken into chips or chunks by any well-known technique. The separated dendrites 130, alone or in combination with pieces of broken core rod 108, can be used to charge the crucible of a crystal-growing furnace. The polycrystalline silicon in the crucible is then melted and a single crystal ingot is pulled from the melt.

Figure 4:
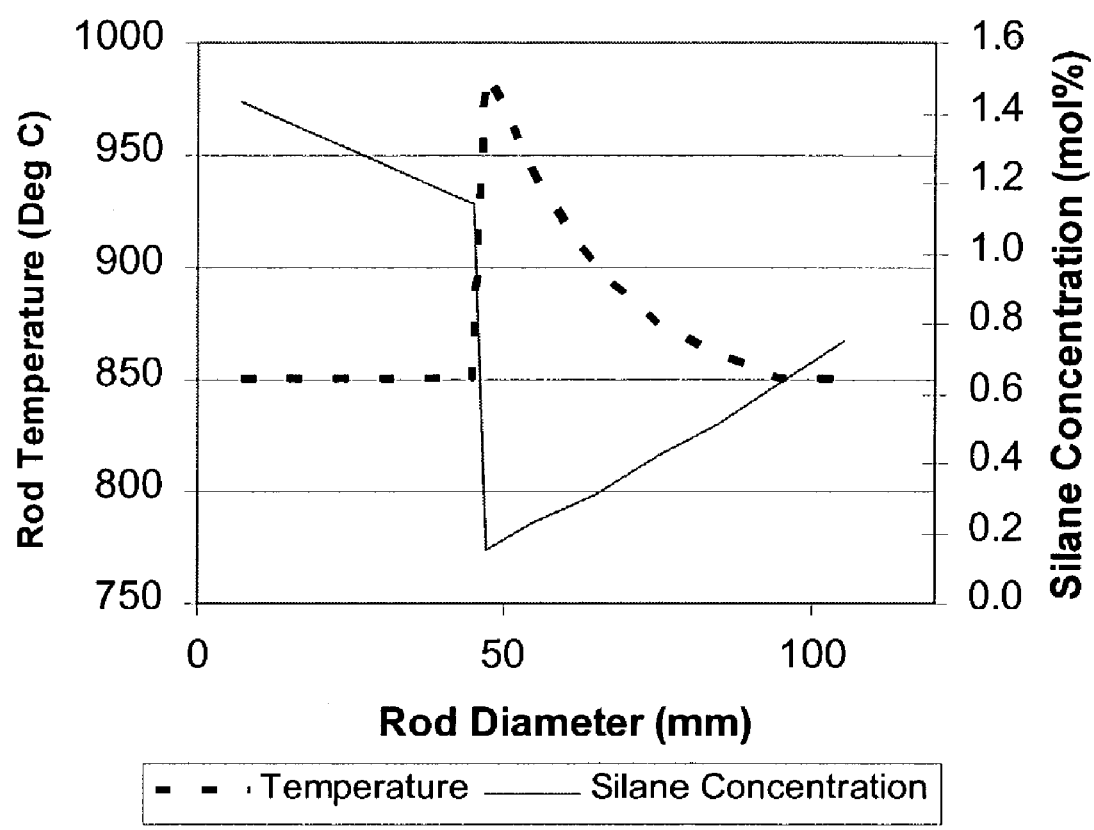
FIG. 4 is a graph showing rod surface temperature and silane concentration vs. rod diameter for a particular method for growing a dendrite-encrusted core rod.

As a specific non-limiting example, dendrite encrusted core rods can be formed in a reactor by employing the conditions illustrated in FIG. 4 and Table 1:

TABLE 1

Growth Conditions at Selected Rod Diameters

| Rod Diameter (mm) | Temperature (° C.) | Silane Conc. (%) |
| --- | --- | --- |
| 7 | 850 | 1.43 |
| 45 | 850 | 1.14 |
| 47 | 986 | 0.15 |
| 55 | 940 | 0.23 |
| 65 | 900 | 0.31 |
| 75 | 875 | 0.42 |
| 85 | 860 | 0.52 |
| 95 | 850 | 0.63 |
| 105 | 850 | 0.75 |

First, silicon core rods 108 that are 45 mm in diameter and 220 cm in length are grown in a reactor previously described. The core rods are formed by electrically heating a 7 mm filament 110 to 850° C. with the silane concentration in the reactor atmosphere maintained roughly in the range of 1.4% to 1.1%. A portion of the silane gas thermally decomposes in the presence of the heated filament 110 and deposits silicon onto the filament by chemical vapor deposition to form a silicon core rod 108.

The resulting core rod 108 at 45 mm diameter has a surface that is relatively smooth with some rounded mounds and no void spaces between mounds, similar to the surface of the rod shown in FIG. 1. The 45 mm core rod serves as a substrate of substantial structural strength, on which dendrite silicon will subsequently be deposited to form a large dendrite-encrusted rod.

The surface temperature of the core rod then is suddenly increased to about 986° C. for purposes of initiating dendrite growth. This rise in rod temperature also increases reaction kinetics and the decomposition rate of silane to silicon on the rod surface. Reactant feed is adjusted to maintain the bulk-gas silane concentration at a reduced concentration of about 0.15% while needle-like dendrites of the type shown in FIG. 2 are formed.

After formation of the needle-like dendrites, the rod surface temperature is lowered gradually from about 986° C. to about 850° C. and the silane content of the reactor atmosphere is raised gradually while silicon continues to deposit. This causes the dendrites to widen to a substantial diameter. The resulting generally teardrop-shaped dendrites, as illustrated in FIG. 3, are about 1–8 mm in diameter at the base end 132 near the core rod and about 6–13 mm in diameter at the cooled distal end 136. These dendrites have an aspect ratio in the range of 1 to 6, with the median aspect ratio being about 3.

As the dendrites grow in length, the dendrite-encrusted silicon rod grows in diameter. The average growth rate of conventional smooth-surfaced polysilicon (rod diameter from 7 mm to 45 mm) is about 2.9 radial-microns per minute. The average growth rate of the dendrite portion of the rod (rod diameter from 45 mm to 105 mm) is about 4.6 radial-microns per minute, a significant increase over the rate at which conventional smooth-surfaced polysilicon rods are grown with silane gas. This increase in growth rate is due to a thermally induced increase in the rate of the decomposition reaction forming silicon from silane. A 24% reduction in the energy requirement is driven by the faster reaction kinetics (i.e. higher deposition rate) associated with the higher temperatures required for dendrite-type growth.

It will be apparent that many changes may be made in the above-described methods and products. Therefore, the scope of the invention should be determined by the following claims.

The invention claimed is:

1. A method for producing a polycrystalline silicon comprising:
heating a surface of a substrate;
exposing the heated surface to an atmosphere that contains at least one silicon-containing compound under conditions that cause a silicon-containing compound in the atmosphere to decompose and deposit tapered dendrites of silicon on the surface; and
gradually reducing the surface temperature of the tapered dendrites while exposing the tapered dendrites to an atmosphere that contains at least one silicon-containing compound such that silicon deposits on the surfaces of the tapered dendrites and forms multiple larger dendrites.

2. The method of claim 1 wherein the heating the surface of the substrate and the exposing the heated surface to the atmosphere are conducted such tat larger dendrites are distributed over substantially the entire heated surface of the substrate.

3. The method of claim 1 wherein the gradually reducing of the surface temperature is at a rate such that the resulting larger dendrites have surfaces that flare outwardly from the substrate.

4. The method of claim 3 wherein the gradually reducing the surface temperature while exposing the tapered dendrites to the atmosphere is conducted such that at least some of the larger dendrites are generally teardrop-shaped.

5. The method of claim 1 wherein the gradually reducing the surface temperature while exposing the tapered dendrites to the atmosphere is conducted such that at least some of the larger dendrites have a stem portion that is no greater than aboat 8 nina in diameter at its narrowest point.

6. The method of claim 1 wherein The atmosphere comprises a silicon-containing compound selected from the group consisting of silane gases, halosilane gases, and mixtures thereof.

7. The method of claim 6 wherein the atmosphere comprises a silicon-containing compound selected from the group consisting of silane ($SiH_4$), disilane ($Si_2H_6$), trisilane ($Si_3H_8$), dichiorosilane ($SiH_2Cl_2$), trichiorosilane ($SiHCl_3$), silicon tetrachioride ($SiCl_4$), dibromosilane ($SiH_2Br_2$), tribromosilane ($SiHBr_3$), silicon tetrabromide ($SiBr_4$) dilodosilane ($SiHI_2I_2$), triiodosilane ($SiHI_3$, silicon tetraiodidc ($SiI_4$), and mixtures thereof.

8. The method of claim 7 wherein the atmosphere comprises silane.

9. The method of claim 7 wherein the atmosphere comprises trichlorosilane.

10. The method of claim 7 wherein the atmosphere comprises trisilane.

11. The method of claim 1 wherein:
the silicon-containing compound is silane ($SiH_4$); and
the exposing of The heated surfhce to an atmosphere that contains at least one silicon-containing compound under conditions that cause a silicon-containing compound in the atmosphere to decompose and deposit tapered dendrites comprises maintaining the surface in a temperature range such that the temperature is at least 875°C. and is below the melting point of silicon during at least a portion of the time when the tapered dendrites are being deposited.

12. The method of claim 11 wherein the decomposing of the silane to form tapered dendrites is at a temperature of at least 9750°C. during at least a portion of the time when the tapered dendrites are being deposited.

13. The method of claim 1 further comprising breaking the larger dendrites oft of the substrate.

14. The method of claim 1 wherein:
silane ($SiH_4$) is the silicon-containing compound;
the decomposing of the silane to form tapered dendrites is conducted in a surface temperature range such that the temperature is at least 875°C. and is below the melting point of silicon during at least a portion of the time when the tapered dendrites are being formed; and
the decomposing of the silane to cause the tapered dendrites to grow into larger dendrites is at a temperature below the melting point of silicon.

15. The method of claim 14 wherein the decomposing of the silane to form tapered dendrites is at a temperature of at least 975°C. during at least a portion of the time when the tapered dendrites are being formed.

16. A method for producing polycrystalline silicon comprising:

providing an elongated polycrystalline silicon core rod;
exposing the surface of the core rod to an atmosphere that contains at least one silicon-containing compound while maintaining the surface temperature of the core rod below the melting point of silicon and sufficiently high that a silicon-containing compound in the atmosphere pyrolytically decomposes and deposits silicon on the surface to provide a rod encrusted with tapered dendrite formations; and
gradually reducing the surface temperature of the rod encrusted with tapered dendrite formations while continuing to expose the tapered dendrite formations to an atmosphere that contains at least one silicon-containing compound such that silicon deposits on the tapered dendrite formations and forms a rod encrusted with multiple larger silicon dendrites.

17. The method of claim 16 wherein the gradually reducing of the surface temperature of the rod encrusted with tapered dendrite formations while continuing to expose the tapered dendrite fonnations to an atmosphere that contains at least one silicon-containing compound is conducted such that larger dendrites are distributed over substantially the entire heated surface of the core rod.

18. The method of claim 16 wherein:
the silicon-containing compound is silane ($SiH_4$); and
the decomposing of die silane to form tapered dendrites is at a surface temperature of at least 875°C. during at least a portion of the time when the tapered dendrites are being formed.

19. The method of claim 18 wherein the decomposing of the silane to form tapered dendrites is at a surfice temperature of at least 975°C. during at least a portion of the time when the tapered dendrites are being formed.

20. The method of claim 16 wherein the gradually reducing of the surface temperature of the rod encrusted with tapered dendrite formations while continuing to expose the tapered dendrite formations to an atmosphere that contains at least one silicon-containing compound is conducted at conditions such that at least some of the larger dendrites are generally teardrop-shaped.

21. The method of claim 16 further comprising forming the core rod by depositing a growth layer of polycrystalline silicon on a starter filament.

22. The method of claim 16 wherein the core rod consists of a filament and the tapered dendrite formations are formed directly on the filament.

23. The method of claim 16 wherein die atmosphere comprises a silicon-containing compound selected from the group consisting of silan and mixtures thereof.

24. The method of claim 23 wherein the atmosphere comprises a silicon-containing compound selected from the group consisting of silane ($SiH_4$), disilane ($Si_2H_6$), trisilane ($Si_3H_8$), dichiorosilane ($SiH_2Ci_2$), trichiorosilane ($SiHCl_3$), silicon tetrachioride ($SiCl_4$), dibrornosilane ($SiH_2Br_2$), tribromosilane ($SiHBr_3$), silicon tetrabromide ($SiBr_4$) diiodosilane ($SiH_2I_2$), trijodosilane ($SiHl_3$), silicon tetrajodide ($SiI_4$), and mixtures thereof.

25. A method for producing polycrystalline silicon comprising:
providing an elongated polycrystalline silicon filament;
depositing a generally cylindrical layer of polycrystalline silicon on the filament to fonn a core rod;
exposing the suitce of the core rod to an atmosphere that comprises silane ($SiH_4$) while maintaining the rod surface a temperature in a range such that the temperature is at least 875°C. and is below the melting point of silicon, during which silane in the gas pyrolytically decomposes and deposits silicon on the surface in tapered dendrite formations and produces a rod encrusted with tapered dendrites; and
gradually reducing the surface temperature of the rod encrusted with tapered dendrites while exposing the tapered dendrites to an atmosphere that contains silane, the surface temperature being reduced at a rate such that silicon deposits on the tapered dendrite formations and forms multiple larger silicon dendrites distributed over substantially the entire heated surface of the rod encrusted with dendrites, at least some of which larger dendrites have a surface that flares outwardly from the core rod; and
separating the larger dendrites from the core rod.

26. The method of claim 25 wherein the exposing of the surface of the core rod to an atmosphere that comprises silane is at a rod surface temperature of at least 975°C. during at least a portion of the time when the tapered dendrites are being deposited.

27. A method for forming single crystal silicon ingots comprising:
growing multiple polycrystalline silicon dendrites on a substrate;
separating the dendrites from the substratc;
charging the crucible of a crystal-growing furnace with dendrites separated from the substrate;
melting the dendrites in the crucible; and
pulling a single crystal ingot from molten silicon in the crucible.

28. The method of claim 27 wherein:
the substrate is a core rod ofpolycrystailine silicon; and
the method further comprises breaking the core rod into chunks and charging the crucible with chunks of the core rod along with the separated dendrites.

* * * * *

UNITED STATES PATENT AND TRADEMARK OFFICE
CERTIFICATE OF CORRECTION

PATENT NO. : 7,105,053 B2 Page 1 of 2
APPLICATION NO. : 10/367570
DATED : September 12, 2006
INVENTOR(S) : Lyle C. Winterton and John P. Hill It is certified that error appears in the above-identified patent and that said Letters Patent is hereby corrected as shown below:

In the Specification:

Column 5, line 63, "the growth desired" should read --the growth of desired--.

In the Claims:

Column 10, line 1, claim 2, "such tat larger" should read --such that larger--.

Column 10, line 16, claim 5, "8 nina in diameter" should read --8 mm in diameter--.

Column 10, line 27, claim 7, "$SiHI_3$, silicon tetraiodidc" should read --$SiHI_3$, silicon tetraiodide--.

Column 10, line 37, claim 11, "The heated surfhce" should read --The heated surface--.

Column 10, line 48, claim 12, "9750°C." should read --975°C.--.

Column 11, line 20, claim 17, "fonnations" should read --formations--.

Column 11, line 26, claim 18, "die silane" should read --the silane--.

Column 11, line 47, claim 23, "die atmosphere" should read --the atmosphere--.

Column 11, line 49, claim 23, "of silan and mixtures" should read --of silane compounds, halosilane compounds, and mixtures--.

Column 12, line 1, claim 24, "dichiorosilane" should read --dichlorosilane--.

Column 12, line 1, claim 24, "trichiorosilane" should read --trichlorosilane--.

Column 12, line 2, claim 24, "tetrachioride" should read --tetrachloride--.

Column 12, line 2, claim 24, "dibrornosilane" should read --dibromosilane--.

Column 12, line 4, claim 24, "trijodosilane" should read --triiodosilane--.

Column 12, line 4, claim 24, "tetrajodide" should read --tetraiodide--.

UNITED STATES PATENT AND TRADEMARK OFFICE
CERTIFICATE OF CORRECTION

PATENT NO. : 7,105,053 B2
APPLICATION NO. : 10/367570
DATED : September 12, 2006
INVENTOR(S) : Lyle C. Winterton and John P. Hill It is certified that error appears in the above-identified patent and that said Letters Patent is hereby corrected as shown below:

Column 12, line 10, claim 25, "fonn" should read --form--.

Column 12, line 11, claim 25, "suitce" should read --surface--.

Column 12, line 13, claim 25, "surface a temperature" should read --surface temperature--.

Column 12, line 39, claim 27, "substratc" should read --substrate--.

Column 12, line 47, claim 28, "ofpolycrystailine" should read --of polycrystalline--.

Signed and Sealed this

Second Day of October, 2007

JON W. DUDAS
*Director of the United States Patent and Trademark Office*